United States Patent
Kim et al.

(10) Patent No.: US 12,228,984 B2
(45) Date of Patent: Feb. 18, 2025

(54) ELECTRONIC DEVICE FOR SUPPLYING POWER AND OPERATION METHOD THEREOF

(71) Applicant: SAMSUNG ELECTRONICS CO., LTD., Suwon-si (KR)

(72) Inventors: Heetae Kim, Suwon-si (KR); Minsu Kim, Suwon-si (KR); Jungtae Kim, Suwon-si (KR); Sanghyun Ryu, Suwon-si (KR); Dongyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/861,400

(22) Filed: Jul. 11, 2022

(65) Prior Publication Data
US 2022/0342468 A1   Oct. 27, 2022

Related U.S. Application Data

(63) Continuation of application No. PCT/KR2021/009909, filed on Jul. 29, 2021.

(30) Foreign Application Priority Data

Jul. 29, 2020 (KR) ........................ 10-2020-0094680

(51) Int. Cl.
   *G06F 1/32*      (2019.01)
   *G01R 31/382*    (2019.01)
   *G06F 1/26*      (2006.01)

(52) U.S. Cl.
   CPC ........... *G06F 1/266* (2013.01); *G01R 31/382* (2019.01)

(58) Field of Classification Search
   CPC ....................................................... G06F 1/26
   See application file for complete search history.

(56) References Cited

U.S. PATENT DOCUMENTS

| | | | |
|---|---|---|---|
| 5,805,513 | A  | 9/1998 | Takahashi et al. |
| 9,899,854 | B2 | 2/2018 | Wei et al. |

(Continued)

FOREIGN PATENT DOCUMENTS

| | | |
|---|---|---|
| EP | 3 435 244 A1 | 1/2019 |
| KR | 1990-0015147 | 10/1990 |

(Continued)

OTHER PUBLICATIONS

India Office Action dated Oct. 30, 2023 for IN Application No. 202337012586.

(Continued)

*Primary Examiner* — Phil K Nguyen
(74) *Attorney, Agent, or Firm* — NIXON & VANDERHYE P.C.

(57) ABSTRACT

An electronic device according to an embodiment may include: a battery; a connector including multiple pins; and at least one processor, and wherein the at least one processor is configured to: identify an external electronic device electrically connected through the connector, identify, among at least two supportable current values, a current value of power to be supplied to the external electronic device, and supply power of the battery to the external electronic device through the connector based on the identified current value.

16 Claims, 10 Drawing Sheets

(56) References Cited

U.S. PATENT DOCUMENTS

| | | | |
|---|---|---|---|
| 10,088,884 B2* | 10/2018 | Jaramillo | H04L 12/40045 |
| 10,521,372 B2 | 12/2019 | Lee et al. | |
| 10,574,074 B2* | 2/2020 | Jung | H02J 7/0047 |
| 10,784,696 B1* | 9/2020 | Pereira | G06F 1/1626 |
| 10,840,730 B2 | 11/2020 | Lim et al. | |
| 2003/0200360 A1* | 10/2003 | Saito | H04L 49/90 |
| | | | 710/5 |
| 2005/0204072 A1* | 9/2005 | Nakagawa | H04L 12/40136 |
| | | | 710/8 |
| 2006/0095642 A1 | 5/2006 | Hesse et al. | |
| 2006/0222059 A1 | 10/2006 | Ruff et al. | |
| 2008/0004004 A1 | 1/2008 | Wu et al. | |
| 2008/0117309 A1 | 5/2008 | Jeon | |
| 2008/0205366 A1 | 8/2008 | Wang et al. | |
| 2008/0320202 A1 | 12/2008 | Monks et al. | |
| 2009/0177820 A1 | 7/2009 | Ranade et al. | |
| 2009/0200982 A1* | 8/2009 | Hurtz | G06F 1/3203 |
| | | | 320/114 |
| 2010/0100643 A1 | 4/2010 | Shim et al. | |
| 2010/0146307 A1* | 6/2010 | Griffin, Jr. | G06F 1/263 |
| | | | 713/300 |
| 2013/0275779 A1* | 10/2013 | He | G06F 1/26 |
| | | | 713/300 |
| 2013/0334883 A1 | 12/2013 | Kim et al. | |
| 2015/0089092 A1 | 3/2015 | Voto et al. | |
| 2015/0169087 A1 | 6/2015 | Kim | |
| 2015/0248151 A1* | 9/2015 | Lim | G06F 13/10 |
| | | | 713/310 |
| 2015/0253842 A1* | 9/2015 | Murata | G06F 1/3287 |
| | | | 713/323 |
| 2015/0270733 A1* | 9/2015 | Inha | H02J 7/342 |
| | | | 320/103 |
| 2015/0340898 A1 | 11/2015 | Schwartz et al. | |
| 2017/0004103 A1 | 1/2017 | Voto et al. | |
| 2017/0255773 A1 | 9/2017 | Yu et al. | |
| 2017/0262785 A1 | 9/2017 | Lee | |
| 2017/0293576 A1 | 10/2017 | Lee | |
| 2017/0333727 A1 | 11/2017 | Kim et al. | |
| 2018/0052799 A1 | 2/2018 | Shetty et al. | |
| 2019/0086994 A1* | 3/2019 | Regupathy | G06F 1/3215 |
| 2019/0250689 A1* | 8/2019 | Ivanov | H02J 1/14 |
| 2019/0250692 A1 | 8/2019 | Kang | |
| 2019/0258832 A1 | 8/2019 | Jung et al. | |
| 2019/0386513 A1 | 12/2019 | Bavisi et al. | |
| 2020/0028373 A1 | 1/2020 | Jiang et al. | |
| 2020/0132734 A1* | 4/2020 | Zhang | G06F 13/38 |
| 2020/0167306 A1* | 5/2020 | Wu | G06F 13/4022 |
| 2020/0213432 A1 | 7/2020 | Li | |
| 2020/0403433 A1 | 12/2020 | Chung et al. | |
| 2021/0110687 A1 | 4/2021 | Shim et al. | |
| 2021/0184507 A1 | 6/2021 | Park et al. | |

FOREIGN PATENT DOCUMENTS

| | | |
|---|---|---|
| KR | 10-2004-0102976 | 12/2004 |
| KR | 10-2005-0043336 | 5/2005 |
| KR | 10-2006-0010433 | 2/2006 |
| KR | 10-0584392 | 5/2006 |
| KR | 10-2006-0066021 | 6/2006 |
| KR | 10-2006-0067726 | 6/2006 |
| KR | 10-2006-0080908 | 7/2006 |
| KR | 10-2006-0088464 | 8/2006 |
| KR | 10-0680217 | 2/2007 |
| KR | 10-2007-0027325 | 3/2007 |
| KR | 10-2007-0056253 | 6/2007 |
| KR | 10-2007-0085550 | 8/2007 |
| KR | 10-2007-0109673 | 11/2007 |
| KR | 10-0774204 | 11/2007 |
| KR | 10-2008-0003200 | 1/2008 |
| KR | 10-2008-0005025 | 1/2008 |
| KR | 10-2008-0007551 | 1/2008 |
| KR | 10-2008-0010026 | 1/2008 |
| KR | 10-2008-0044482 | 5/2008 |
| KR | 10-2008-0048459 | 6/2008 |
| KR | 10-2008-0048605 | 6/2008 |
| KR | 10-2008-0050234 | 6/2008 |
| KR | 10-2008-0097567 | 11/2008 |
| KR | 10-2009-0122797 | 12/2009 |
| KR | 10-2010-0023966 | 3/2010 |
| KR | 10-2012-0012057 | 2/2012 |
| KR | 10-2012-0042445 | 5/2012 |
| KR | 10-1253723 | 4/2013 |
| KR | 10-1259488 | 5/2013 |
| KR | 10-2013-0078660 | 7/2013 |
| KR | 10-2013-0142312 | 12/2013 |
| KR | 10-1368755 | 2/2014 |
| KR | 10-1384855 | 4/2014 |
| KR | 10-2014-0052438 | 5/2014 |
| KR | 10-1400113 | 5/2014 |
| KR | 10-1400116 | 5/2014 |
| KR | 10-2014-0083450 | 7/2014 |
| KR | 10-1416497 | 7/2014 |
| KR | 10-1422692 | 7/2014 |
| KR | 10-2014-0117936 | 10/2014 |
| KR | 10-1453929 | 10/2014 |
| KR | 10-1456582 | 11/2014 |
| KR | 10-2014-0141739 | 12/2014 |
| KR | 10-1487763 | 1/2015 |
| KR | 10-1505509 | 3/2015 |
| KR | 10-1520935 | 5/2015 |
| KR | 10-1545306 | 8/2015 |
| KR | 10-2015-0107343 | 9/2015 |
| KR | 10-1548937 | 9/2015 |
| KR | 10-1551683 | 9/2015 |
| KR | 10-1556079 | 9/2015 |
| KR | 10-2015-0113729 | 10/2015 |
| KR | 10-1554681 | 10/2015 |
| KR | 10-1558914 | 10/2015 |
| KR | 10-1585063 | 1/2016 |
| KR | 10-1603988 | 3/2016 |
| KR | 10-1612910 | 4/2016 |
| KR | 10-2016-0055082 | 5/2016 |
| KR | 10-2016-0058933 | 5/2016 |
| KR | 10-1631705 | 6/2016 |
| KR | 10-1633275 | 7/2016 |
| KR | 10-2016-0099352 | 8/2016 |
| KR | 10-1654034 | 8/2016 |
| KR | 10-1657940 | 9/2016 |
| KR | 10-2016-0120841 | 10/2016 |
| KR | 10-2017-0045528 | 4/2017 |
| KR | 10-1721447 | 4/2017 |
| KR | 10-1727588 | 4/2017 |
| KR | 10-1738412 | 5/2017 |
| KR | 10-2017-0077591 | 7/2017 |
| KR | 10-2017-0081532 | 7/2017 |
| KR | 10-2017-0085347 | 7/2017 |
| KR | 10-2010-0101685 | 9/2017 |
| KR | 10-2017-0104356 | 9/2017 |
| KR | 10-2017-0104896 | 9/2017 |
| KR | 10-2017-0116576 | 10/2017 |
| KR | 10-2017-0116679 | 10/2017 |
| KR | 10-2017-0118295 | 10/2017 |
| KR | 10-2017-0125652 | 11/2017 |
| KR | 10-2017-0137312 | 12/2017 |
| KR | 10-1854535 | 5/2018 |
| KR | 10-2018-0080625 | 7/2018 |
| KR | 10-2018-0115200 | 10/2018 |
| KR | 10-20180115200 A | 10/2018 |
| KR | 10-2018-0129141 | 12/2018 |
| KR | 10-2019-0000771 | 1/2019 |
| KR | 10-2019-0010381 | 1/2019 |
| KR | 10-2019-0016674 | 2/2019 |
| KR | 10-2019-0017119 | 2/2019 |
| KR | 10-1947486 | 2/2019 |
| KR | 10-2019-0038180 | 4/2019 |
| KR | 10-2019-0039017 | 4/2019 |
| KR | 10-2019-0044462 | 4/2019 |
| KR | 10-2019-0049256 | 5/2019 |
| KR | 10-2019-0049256 A | 5/2019 |
| KR | 10-2019-0058704 | 5/2019 |
| KR | 10-1983762 | 5/2019 |
| KR | 10-2019-0061858 | 6/2019 |
| KR | 10-2019-0097485 | 8/2019 |

(56) References Cited

FOREIGN PATENT DOCUMENTS

| KR | 10-2019-0100601 | 8/2019 |
| KR | 10-2019-0101823 | 9/2019 |
| KR | 10-1999574 | 9/2019 |
| KR | 10-2027256 | 10/2019 |
| KR | 10-2019-0141614 | 12/2019 |
| KR | 10-2020-0010177 | 1/2020 |
| KR | 10-2020-0020121 | 2/2020 |
| KR | 10-2111493 | 5/2020 |

OTHER PUBLICATIONS

Extended European Search Report dated Nov. 28, 2023 for EP Application No. 21850774.7.
Office Action for KR Application No. 10-2020-0094680 issued Oct. 18, 2024 and English translation.
Office Action for EP Application No. 21850774.7 dated Nov. 22, 2024, 4 pages.

\* cited by examiner

ELECTRONIC DEVICE FOR SUPPLYING POWER AND OPERATION METHOD THEREOF

CROSS-REFERENCE TO RELATED APPLICATION

This application is a continuation of International Application No. PCT/KR2021/009909 designating the United States, filed on Jul. 29, 2021, in the Korean Intellectual Property Receiving Office and claiming priority Korean Patent Application No. 10-2020-0094680, filed on Jul. 29, 2020, in the Korean Intellectual Property Office, the disclosures of which are incorporated by reference herein in their entireties.

BACKGROUND

Field

The disclosure relates to an electronic device for supplying power and an operation method thereof.

Description of Related Art

An electronic device may provide power to an external electronic device using wired and wireless interfaces. Such an electronic device may include a power management integrated circuit (PMIC) for managing power supplied to the external electronic device.

The above information is presented as background information only to assist with an understanding of the disclosure. No determination has been made, and no assertion is made, as to whether any of the above might be applicable as prior art with regard to the disclosure.

An electronic device may provide power to an external electronic device, based on a protocol related to a wired interface. In this case, the external electronic device may fail to receive the necessary amount of power. Accordingly, the external electronic device may fail to operate.

SUMMARY

Technical problems addressed in the disclosure are not limited to the above-mentioned technical problems, and other technical problems not mentioned herein will be clearly understood from the following description by those skilled in the art to which the disclosure pertains.

An electronic device according to an example embodiment may include: a battery; a connector including multiple pins; and at least one processor, wherein the at least one processor is configured to: identify an external electronic device electrically connected through the connector; identify, among at least two supportable current values, a current value of power to be supplied to the external electronic device; and supply, based on the identified current value, power of the battery to the external electronic device through the connector.

A method of operating an electronic device according to an example embodiment may include: identifying an external electronic device electrically connected through a connector of the electronic device; identifying, among at least two supportable current values, a current value of power to be supplied to the external electronic device; and supplying, based on the identified current value, power of a battery of the electronic device to the external electronic device through the connector.

An electronic device and an operation method thereof, according to various example embodiments, may provide necessary power to an external electronic device.

Advantageous effects obtainable from the disclosure are not limited to the above-mentioned advantageous effects, and other advantageous effects not mentioned herein will be clearly understood from the following description by those skilled in the art to which the disclosure pertains.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Figure 1:
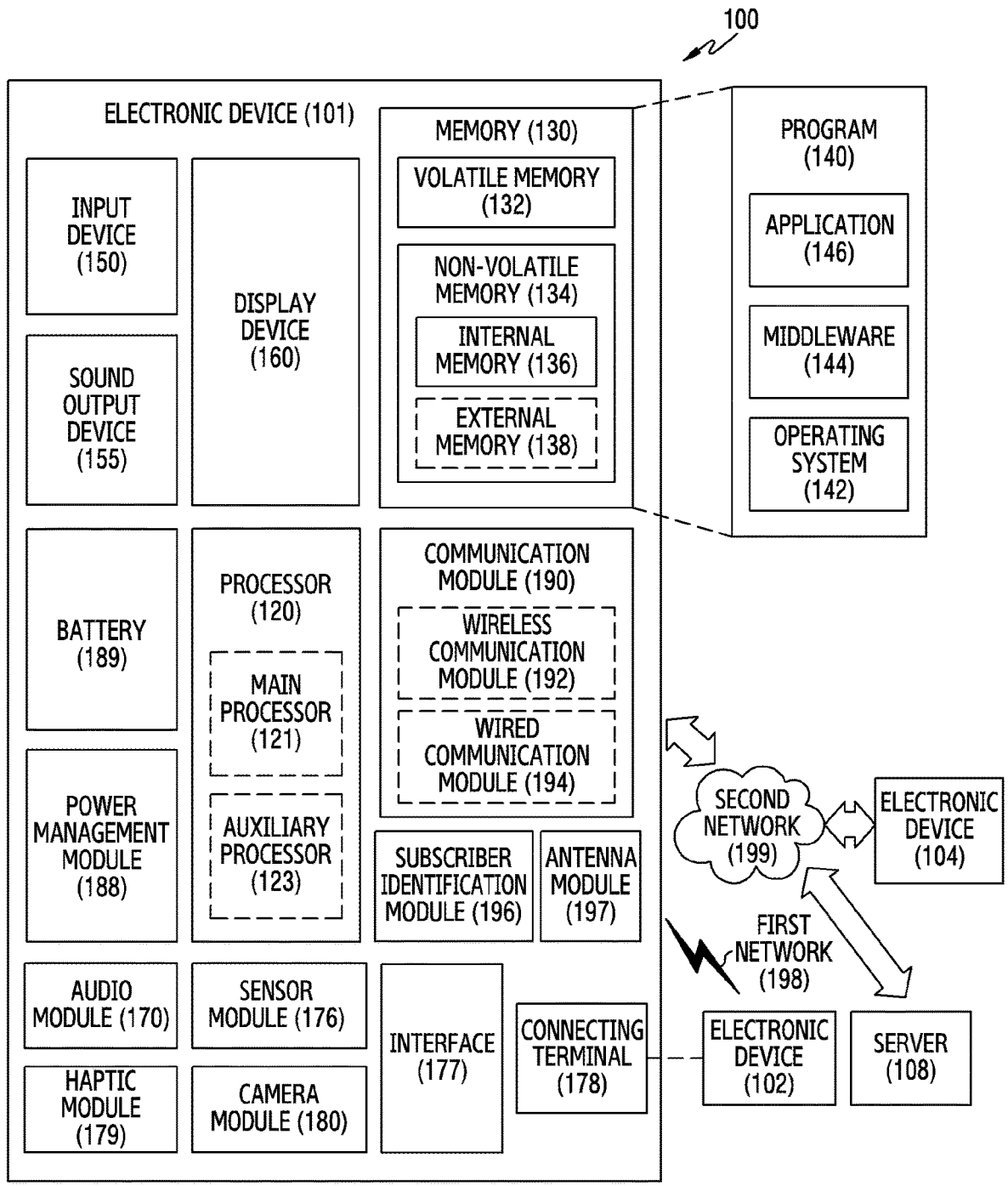
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
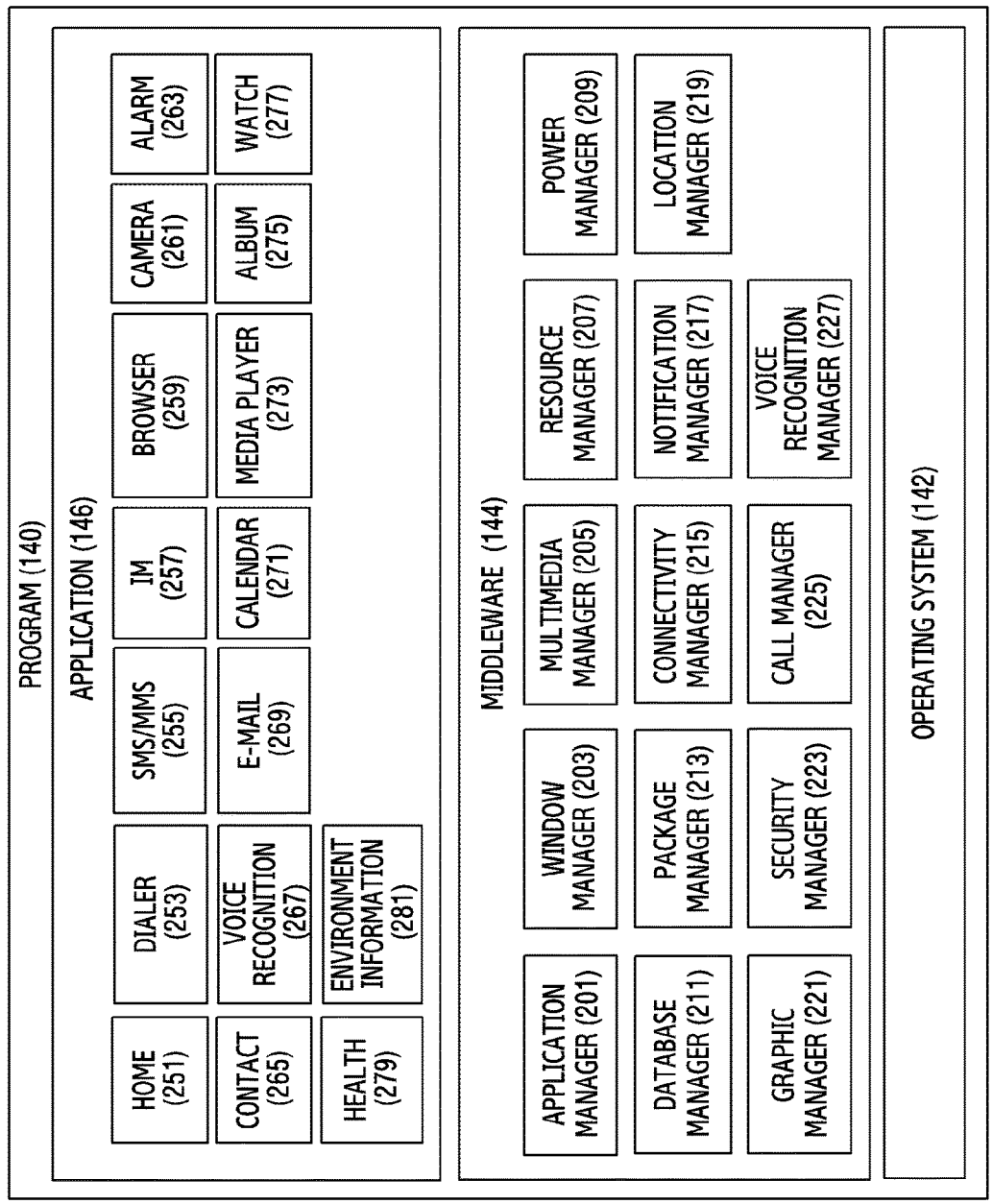
FIG. 2 is a block diagram illustrating an example program according to various embodiments.

FIG. 2 is a block diagram 200 illustrating an example of the program 140 according to various embodiments. According to an embodiment, the program 140 may include an operating system (OS) 142 to control one or more resources of the electronic device 101, middleware 144, or an application 146 executable in the OS 142. The OS 142 may include, for example, Android™, iOS™, Windows™, Symbian™, Tizen™, or Bada™. At least part of the program 140, for example, may be pre-loaded on the electronic device 101 during manufacture, or may be downloaded from or updated by an external electronic device (e.g., the electronic device 102 or 104, or the server 108) during use by a user.

The OS 142 may control management (e.g., allocating or deallocation) of one or more system resources (e.g., process, memory, or power source) of the electronic device 101. The OS 142 may include one or more driver programs to drive other hardware devices of the electronic device 101, for example, the input device 150, the sound output device 155, the display device 160, the audio module 170, the sensor module 176, the interface 177, the haptic module 179, the camera module 180, the power management module 188, the battery 189, the communication module 190, the subscriber identification module 196, or the antenna module 197.

The middleware 144 may provide various functions to the application 146 such that a function or information provided from one or more resources of the electronic device 101 may be used by the application 146. The middleware 144 may include, for example, an application manager 201, a window manager 203, a multimedia manager 205, a resource manager 207, a power manager 209, a database manager 211, a package manager 213, a connectivity manager 215, a notification manager 217, a location manager 219, a graphic manager 221, a security manager 223, a telephony manager 225, and/or a voice recognition manager 227.

The application manager 201, for example, may manage the life cycle of the application 146. The window manager 203, for example, may manage one or more graphical user interface (GUI) resources that are used on a screen. The multimedia manager 205, for example, may identify one or more formats to be used to play media files, and may encode or decode a corresponding one of the media files using a codec appropriate for a corresponding format selected from the one or more formats. The resource manager 207, for example, may manage the source code of the application 146 or a memory space of the memory 130. The power manager 209, for example, may manage the capacity, temperature, or power of the battery 189, and determine or provide related information to be used for the operation of the electronic device 101 based at least in part on corresponding information of the capacity, temperature, or power of the battery 189. According to an embodiment, the power manager 209 may interwork with a basic input/output system (BIOS) (not shown) of the electronic device 101.

The database manager 211, for example, may generate, search, or change a database to be used by the application 146. The package manager 213, for example, may manage installation or update of an application that is distributed in the form of a package file. The connectivity manager 215, for example, may manage a wireless connection or a direct connection between the electronic device 101 and the external electronic device. The notification manager 217, for example, may provide a function to notify a user of an occurrence of a specified event (e.g., an incoming call, message, or alert). The location manager 219, for example, may manage locational information on the electronic device 101. The graphic manager 221, for example, may manage one or more graphic effects to be offered to a user or a user interface related to the one or more graphic effects.

The security manager 223, for example, may provide system security or user authentication. The telephony manager 225, for example, may manage a voice call function or a video call function provided by the electronic device 101. The voice recognition manager 227, for example, may transmit a user's voice data to the server 108, and receive, from the server 108, a command corresponding to a function to be executed on the electronic device 101 based at least in part on the voice data, or text data converted based at least in part on the voice data. According to an embodiment, the middleware 244 may dynamically delete some existing components or add new components. According to an embodiment, at least part of the middleware 144 may be included as part of the OS 142 or may be implemented as another software separate from the OS 142.

The application 146 may include, for example, a home 251, dialer 253, short message service (SMS)/multimedia messaging service (MMS) 255, instant message (IM) 257, browser 259, camera 261, alarm 263, contact 265, voice recognition 267, email 269, calendar 271, media player 273, album 275, watch 277, health 279 (e.g., for measuring the degree of workout or biometric information, such as blood sugar), and/or environmental information 281 (e.g., for measuring air pressure, humidity, or temperature information) application. According to an embodiment, the application 146 may further include an information exchanging application (not shown) that is capable of supporting information exchange between the electronic device 101 and the external electronic device. The information exchange application, for example, may include a notification relay application adapted to transfer designated information (e.g., a call, message, or alert) to the external electronic device or a device management application adapted to manage the external electronic device. The notification relay application may transfer notification information corresponding to an occurrence of a specified event (e.g., receipt of an email) at another application (e.g., the email application 269) of the electronic device 101 to the external electronic device. Additionally or alternatively, the notification relay application may receive notification information from the external electronic device and provide the notification information to a user of the electronic device 101.

The device management application may control the power (e.g., turn-on or turn-off) or the function (e.g., adjustment of brightness, resolution, or focus) of the external electronic device or some component thereof (e.g., a display device or a camera module of the external electronic device). The device management application, additionally or alternatively, may support installation, delete, or update of an application running on the external electronic device.

Figure 3:
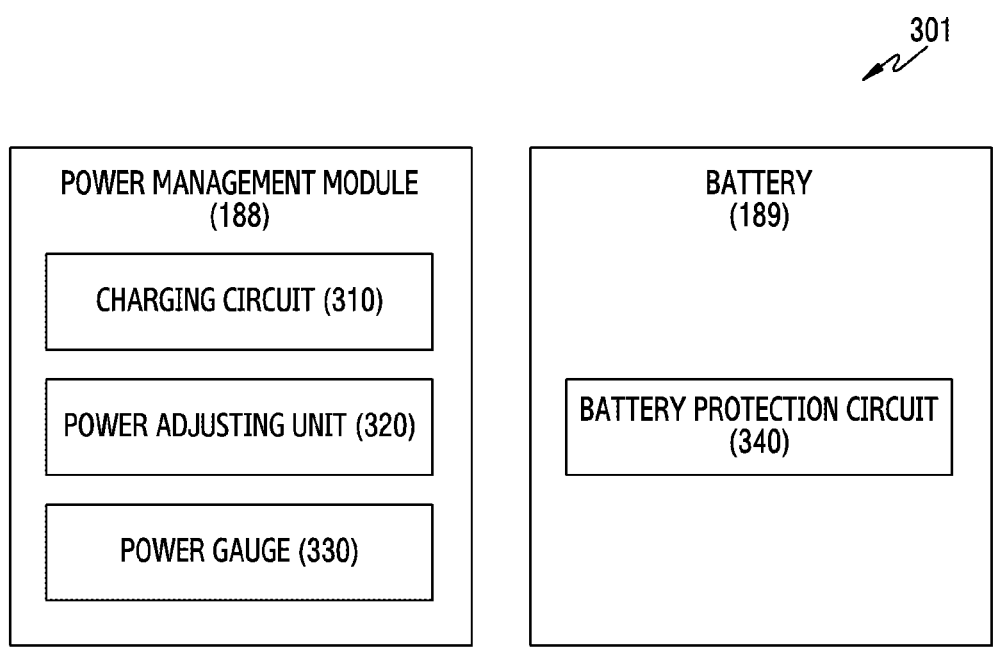
FIG. 3 is a block diagram illustrating an example configuration of a power management module and a battery according to various embodiments.

FIG. 3 is a block diagram 300 illustrating an example configuration of a power management module 188 and the battery 189 according to various embodiments. Referring to FIG. 3, the power management module 188 may include charging circuit including circuitry 310, a power adjusting unit (e.g., including power adjusting circuitry) 320, and/or a power gauge 330. The charging circuitry 310 may charge the battery 189 using power supplied from an external power source outside the electronic device 101. According to an embodiment, the charging circuitry 310 may select a charging scheme (e.g., normal charging or quick charging) based at least in part on, for example, and without limitation, a type of the external power source (e.g., a power outlet, a USB, or wireless charging), magnitude of power suppliable from the external power source (e.g., about 20 Watt or more), an attribute of the battery 189, etc., and may charge the battery 189 using the selected charging scheme. The external power source may be connected with the electronic device 101, for example, directly via the connecting terminal 178 or wirelessly via the antenna module 197.

The power adjusting unit 320 may include various power adjusting circuitry and generate a plurality of powers having different voltage levels or different current levels by adjusting a voltage level or a current level of the power supplied from the external power source or the battery 189. The power adjusting unit 320 may adjust the voltage level or the current level of the power supplied from the external power source or the battery 189 into a different voltage level or current level appropriate for each of some of the components included in the electronic device 101. According to an embodiment, the power adjusting unit 320 may include various circuitry implemented in the form of a low drop out (LDO) regulator or a switching regulator. The power gauge 330 may measure use state information about the battery 189 (e.g., a capacity, a number of times of charging or discharging, a voltage, or a temperature of the battery 189).

The power management module 188 may determine, using, for example, the charging circuitry 310, the power adjusting unit 320, and/or the power gauge 330, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a battery protection circuit module (PCM) including a battery protection circuit 340. The PCM 340 may perform one or more of various functions (e.g., a pre-cutoff function) to prevent a performance deterioration of, or a damage to, the battery 189. The PCM 340, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 330, or the power management module 188.

According to an embodiment, the corresponding sensor (e.g., a temperature sensor) of the sensor module 176 may be included as part of the PCM 340, or may be disposed near the battery 189 as a separate device.

Figure 4:
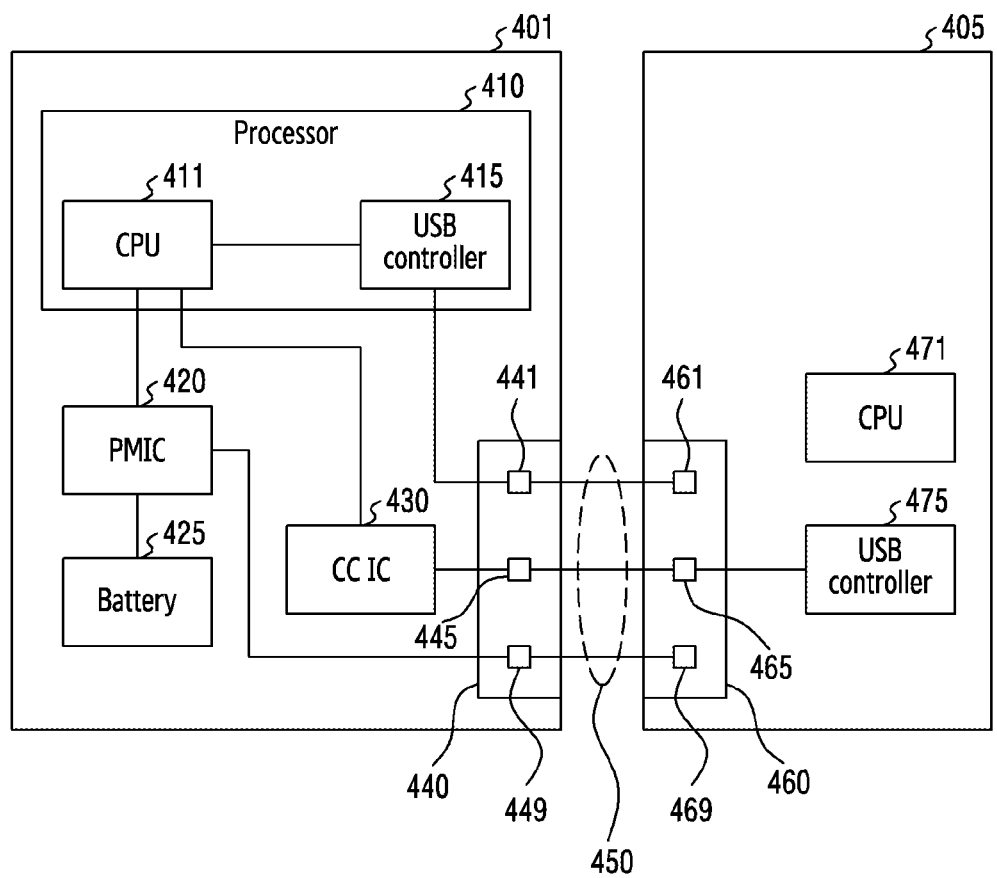
FIG. 4 is a block diagram illustrating an example electronic device and an external electronic device according to various embodiments.
Figure 5:
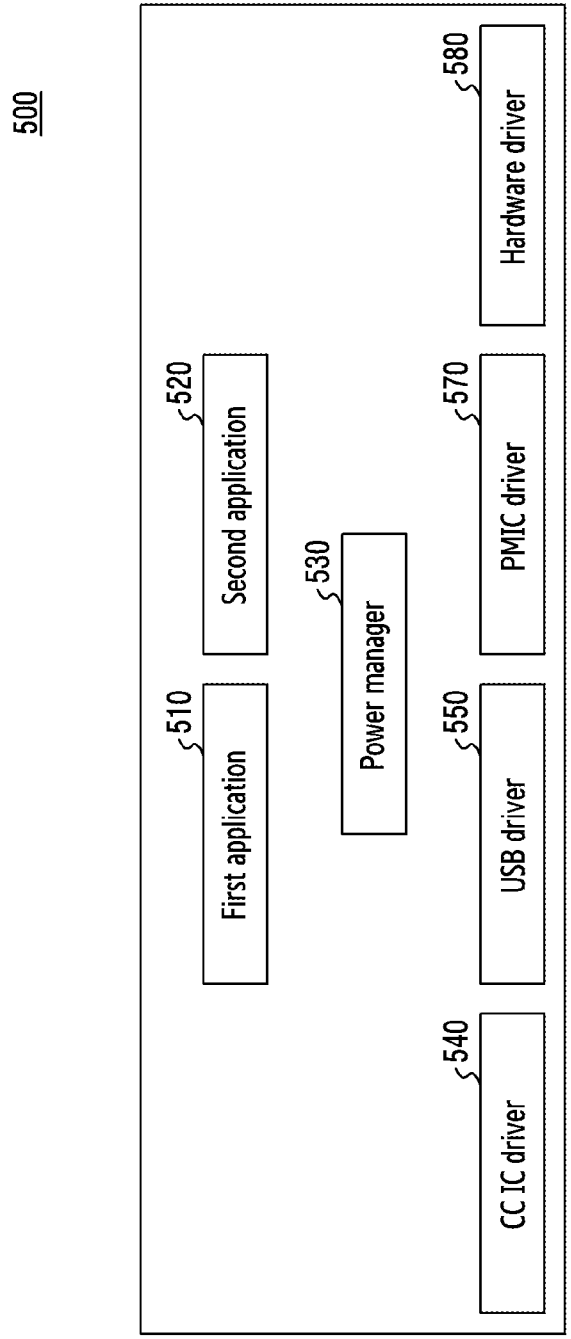
FIG. 5 is a block diagram illustrating an example program executed in an electronic device according to various embodiments.

FIG. 4 is a block diagram 400 illustrating an example configuration of an electronic device 401 and an external electronic device 405 according to various embodiments. FIG. 5 is a block diagram 500 illustrating an example program executed in the electronic device 401 according to various embodiments. In an embodiment, the electronic device 401 in FIG. 4 may correspond to the electronic device 101 in FIG. 1. In an embodiment, the external electronic device 405 in FIG. 4 may correspond to the external electronic device 102 in FIG. 1. In an embodiment, the program in FIG. 5 may correspond to the program 140 in FIG. 2.

In an embodiment, the electronic device 401 and the external electronic device 405 may function, while being electrically connected to each other (e.g., while a connector 440 and a connector 460 are electrically connected to each other), as at least one of a master (e.g., a host, a source, or a downstream facing port (DFP) or a slave (e.g., a peripheral device, a sink, or an upstream facing port (UFP)). In an embodiment, while the electronic device 401 and the external electronic device 405 are electrically connected to each other through the connector 440 and the connector 460, the electronic device 401 and the external electronic device 405 may determine the roles thereof through negotiation in a configuration process.

In an embodiment, a master device (e.g., the electronic device 401) may detect attachment or removal of a slave device (e.g., the external electronic device 405) through a connector (e.g., the connector 440). In an embodiment, the master device (e.g., the electronic device 401) may enumerate the slave device (e.g., the external electronic device 405). In an embodiment, the master device (e.g., the electronic device 401) may allocate an address to the slave device (e.g., the external electronic device 405) through the enumeration. In an embodiment, the master device (e.g., the electronic device 401) may manage data flow between the master device (e.g., the electronic device 401) and the slave device (e.g., the external electronic device 405). In an embodiment, the master device (e.g., the electronic device 401) may supply power to the slave device (e.g., the external electronic device 405).

In an embodiment, in terms of data transmission, a device (e.g., the electronic device 401) configured to manage data flow may be called a host. In an embodiment, in terms of data transmission, a device (e.g., the external electronic device 405) configured to transmit data under control of a host may be called a peripheral device.

In an embodiment, in terms of power transmission, a device (e.g., the electronic device 401) configured to supply power may be a source. In an embodiment, in terms of power transmission, a device (e.g., the external electronic device 405) configured to receive power may be called a sink.

In an embodiment, the electronic device 401 may include a processor (e.g., including processing circuitry) 410, a power management integrated circuit (PMIC) 420, a battery 425, a configuration channel integrated circuit (CC IC) 430, and a connector 440. In an embodiment, the processor 410 may correspond to the processor 120 in FIG. 1. In an embodiment, the PMIC 420 may correspond to the power management module 188 in FIGS. 1 and 3. In an embodiment, the battery 425 may correspond to the battery 189 in FIGS. 1 and 3. In an embodiment, the connector 440 may correspond to the connection terminal 178 in FIG. 1.

In an embodiment, the processor 410 may be connected to elements (e.g., the PMIC 420, the CC IC 430, and the connector 440) of the electronic device 401. In an embodiment, the processor 410 may include various processing circuitry including a CPU 411 and a USB controller 415.

In an embodiment, the CPU 411 of the processor 410 may include various processing circuitry and execute a program for controlling the electronic device 401. In an embodiment, data for executing a program may be stored in a memory (e.g., the memory 130 in FIG. 1) of the electronic device 401.

In an embodiment, the CPU 411 may execute at least one application (a first application 510 or a second application 520). In an embodiment, the first application 510 may be an application related to the external electronic device 405. In an embodiment, the second application 520 (e.g., an application for providing a payment service) may be an application which is not related to the external electronic device 405.

In an embodiment, the CPU 411 may drive at least one type of middleware (e.g., a power manager 530). In an embodiment, the power manager 530 may correspond to the power manager 209 in FIG. 2.

In an embodiment, the CPU 411 may drive at least one driver (e.g., a CC IC driver 540, a USB driver 550, a PMIC driver 570, a hardware driver 580 (e.g., a display driver or a camera driver), or a combination thereof). In an embodiment, the CC IC driver 540 may include a program for controlling the CC IC 430. In an embodiment, the USB driver 550 may include a program for controlling the USB controller 415. In an embodiment, the PMIC driver 570 may include a program for controlling the PMIC 420. In an embodiment, the hardware driver 580 may include a program for controlling a hardware element (e.g., a display or a camera) corresponding to the hardware driver 580.

In an embodiment, the CPU 411 may establish, through the CC IC driver 540, a communication channel for communication with the external electronic device 405. In an embodiment, the CPU 411 may transmit or receive a USB power delivery (PD) message (e.g., a vendor defined message (VDM)) to or from the external electronic device 405 through the CC IC driver 540. In an embodiment, the CPU 411 may obtain identification information of the external electronic device 405 using the USB PD message obtained through the CC IC driver 540. In an embodiment, the identification information may include vendor identity (VID) or product identity (PID). In an embodiment, VID may be information for identifying a vendor of the external electronic device 405. In an embodiment, VID may be formed by 2 bytes. In an embodiment, PID may be information for identifying product information of the external electronic device 405. In an embodiment, PID may be formed by 2 bytes.

In an embodiment, the CPU 411 may determine a current value of power to be supplied to the external electronic device 405, based on the identification information of the external electronic device 405 identified through the CC IC driver 540.

In an embodiment, the CPU 411 may determine, based on the identification information, whether the external electronic device 405 requires power having a high current value. In an embodiment, when the identification information is included in a list, the CPU 411 may determine that the external electronic device 405 requires power having a high current value. In an embodiment, the list may include identification information regarding devices which require power having a high current value. In an embodiment, the list may be stored in a memory (e.g., the memory 130 in FIG. 1) of the electronic device 401.

In an embodiment, when the identification information indicates a designated type of device (e.g., a device for providing contents related to augmented reality (AR)), the CPU 411 may determine that the external electronic device 405 is a device which requires power having a high current value.

In an embodiment, the CPU 411 may transmit or receive data to or from the external electronic device 405 through the USB driver 550. In an embodiment, the CPU 411 may transmit data indicating the result of execution of the first application 510 to the external electronic device 405 through the USB driver 550. In an embodiment, the CPU 411 may receive data, which is to be input into the first application 510, from the external electronic device 405 through the USB driver 550.

In an embodiment, the CPU 411 may determine, based on the execution or non-execution of the first application 510, whether the external electronic device 405 requires power having a high current value. In an embodiment, when the first application 510 is being executed, the CPU 411 may determine that the external electronic device 405 requires power having a high current value.

In an embodiment, when the first application 510 is being executed, the CPU 411 may determine, based on a function provided by the first application 510 through the external electronic device 405, whether the external electronic device 405 requires power having a high current value. In an embodiment, when the first application 510 is performing a designated function, the CPU 411 may determine that the external electronic device 405 requires power having a high current value. In an embodiment, the designated function may be a function for outputting contents (e.g., contents related to AR) to the external electronic device 405.

In an embodiment, the CPU 411 may supply power of the battery 425 to other elements of the electronic device 401 through the PMIC driver 570 of the electronic device 401. In an embodiment, the CPU 411 may supply power of the battery 425 to the external electronic device 405 through the PMIC driver 570.

In an embodiment, the CPU 411 may determine, based on state information of the battery 425, whether the electronic device 401 can supply power having a high current value to the external electronic device 405.

In an embodiment, when the level (e.g., state of charging (SOC)) of the battery 425 is equal to or higher than a designated level (e.g., 30%), the CPU 411 may determine that the electronic device 401 can supply power having a high current value to the external electronic device 405. In an embodiment, when the level of the battery 425 is lower than the designated level, the CPU 411 may determine that the electronic device 401 cannot supply power having a high current value to the external electronic device 405.

In an embodiment, when the battery 425 is being charged, the CPU 411 may determine that the electronic device 401 can supply power having a high current value to the external electronic device 405. In an embodiment, when the battery 425 is being charged in a wireless manner, the CPU 411 may determine that the electronic device 401 can supply power having a high current value to the external electronic device 405.

In an embodiment, when the voltage of the battery 425 is equal to or higher than a designated voltage (e.g., 1.5 volts (V)), the CPU 411 may determine that the electronic device 401 can supply power having a high current value to the external electronic device 405. In an embodiment, when the voltage of the battery 425 is lower than a designated voltage (e.g., 2.6 volts (V)), the CPU 411 may determine that the electronic device 401 can supply power having a high current value to the external electronic device 405.

In an embodiment, when the temperature of the electronic device 401 (e.g., the temperature of the battery 425) is equal to or lower than a designated temperature, the CPU 411 may determine that the electronic device 401 can supply power having a high current value to the external electronic device 405. In an embodiment, when the temperature of the electronic device 401 (e.g., the temperature of the battery 425) is lower than a designated temperature, the CPU 411 may determine that the electronic device 401 can supply power having a high current value to the external electronic device 405.

In an embodiment, when it is possible to supply power having a high current value to the external electronic device 405, the CPU 411 may control the PMIC 420 to supply the power having a high current value to the external electronic device 405. In an embodiment, when it is impossible to supply power having a high current value to the external electronic device 405, the CPU 411 may control the PMIC 420 to supply power having a low current value to the external electronic device 405. In an embodiment, the power having a high current value may, for example, be about 1.5 amperes (A). In an embodiment, the power having a lower current value may, for example, be about 0.9 amperes (A). In an embodiment, the electronic device 401 may, for example, supply, to the external electronic device 405, 0.5-ampere (A) or 3-ampere (A) power as well as 0.9-ampere (A) or 1.5-ampere (A) power.

In an embodiment, the CPU 411 may control operation of hardware elements of the electronic device 401 (e.g., a display (e.g., the display device 160 in FIG. 1) and a camera (e.g., the camera module 180 in FIG. 1)) through the hardware driver 580.

In an embodiment, the CPU 411 may limit functions of the hardware elements (e.g., the display and the camera) while power having a high current value is supplied to the external electronic device 405.

In an embodiment, the CPU 411 may limit the luminance of the display through the hardware driver 580. In an embodiment, the CPU 411 may reduce the luminance of the display to below a designated luminance through the hardware driver 580.

In an embodiment, the CPU 411 may limit driving of a camera through the hardware driver 580. In an embodiment, the CPU 411 may limit execution of camera-related functions through the hardware driver 580. In an embodiment, the CPU 411 may limit, through the hardware driver 580, the resolution of the camera (e.g., the resolution of a preview image or the resolution of a captured image) to below a designated resolution. In an embodiment, the CPU 411 may stop driving of the flash of the camera through the hardware driver 580.

In an embodiment, the CPU 411 may limit functions of hardware elements, which are not used by the first application 510, while power having a high current value is supplied to the external electronic device 405.

In an embodiment, the CPU 411 may stop driving of the second application 520 (e.g., an application for providing a payment service) unrelated to the external electronic device 405 while power having a high current value is supplied to the external electronic device 405. In an embodiment, the CPU 411 may stop driving of an application, which does not transmit or receive data to or from the external electronic device 405, while power having a high current value is supplied to the external electronic device 405.

In an embodiment, the USB controller 415 may form an electrical path 450 with the external electronic device 405 through the connector 440. In an embodiment, the USB controller 415 may transmit or receive data to or from the external electronic device 405 using the electrical path 450. In an embodiment, the USB controller 415 may transmit or receive data to or from the external electronic device 405 through a data pin 441 of the connector 440 (e.g., a TX pin, an RX pin, a D+ pin, or a D− pin of a USB Type-C connector).

In an embodiment, the PMIC 420 may be connected to the processor 410 (e.g., the CPU 411) and the battery 425.

In an embodiment, the PMIC 420 may provide, to the processor 410, state information of the battery 425 (e.g., the amount of electric charge, the charging state, the voltage, or the temperature of the battery 425, or a combination thereof).

In an embodiment, the PMIC 420 may supply power of the battery 425 to other elements of the electronic device 401. In an embodiment, the PMIC 420 may supply, under control of the CPU 411, power of the battery 425 to other elements of the electronic device 401.

In an embodiment, the PMIC 420 may supply power of the battery 425 to the external electronic device 405. In an embodiment, the PMIC 420 may supply, under control of the CPU 411, power of the battery 425 to the external electronic device 405. In an embodiment, the PMIC 420 may supply power to the external electronic device 405 through a power pin 449 of the connector 440 (e.g., a VCONN pin or a VBUS pin of a USB Type-C connector).

In an embodiment, the PMIC 420 may change a current value of the power which is supplied, under control of the CPU 411, to the external electronic device 405.

In an embodiment, the PMIC 420 may charge the battery 425 using power that is wiredly or wirelessly acquired from the outside. In an embodiment, the PMIC 420 may supply power to other elements of the electronic device 401 while power is acquired from the outside. In an embodiment, the PMIC 420 may wiredly or wirelessly supply power to the external electronic device 405 while power is acquired from the outside.

In an embodiment, the CC IC 430 may be connected to the processor 410 (e.g., the CPU 411) and the connector 440.

In an embodiment, the CC IC 430 may establish a communication channel for communication between the electronic device 401 and the external electronic device 405. In an embodiment, the CC IC 430 may establish a communication channel with the external electronic device 405 through a CC pin 445 of the connector 440 (e.g., a CC1 pin or CC2 pin of a USB Type-C connector).

In an embodiment, the CC IC 430 may transmit or receive a USB power delivery (PD) message to or from the external electronic device 405. In an embodiment, the CC IC 430 may transmit or receive a vendor defined message (VDM) to or from the external electronic device 405 through the USB PD message.

In an embodiment, the CC IC 430 may provide the received USB PD message to the processor 410. In an embodiment, the CC IC 430 may provide the received VDM to the processor 410.

In an embodiment, the CC IC 430 may obtain identification information of the external electronic device 405 through the USB PD message. In an embodiment, the CC IC 430 may provide the obtained identification information to the processor 410. In an embodiment, the identification information may include vendor identity (VID) and product identity (PID). In an embodiment, VID may be information for identifying a vendor of the external electronic device 405. In an embodiment, VID may, for example, be formed by 2 bytes. In an embodiment, PID may be information for identifying product information of the external electronic device 405. In an embodiment, PID may, for example, be formed by 2 bytes.

In an embodiment, the CC IC 430 in FIG. 4 may be replaced with another element or may be excluded. In an embodiment, when the connector 440 is implemented as a connector based on any standard other than USB type-C, the CC IC 430 may be replaced with another element or may be excluded.

In an embodiment, when the connector 440 is another type of USB connector (e.g., USB Type-A mini, USB Type-A micro, USB Type-B mini, or USB Type-B micro), the CC IC 430 may be replaced with an identity (ID) identification module. In an embodiment, the ID identification module may obtain identification information of the external electronic device 405 by identifying a resistance value of the external electronic device 405 through the connector 440. In an embodiment, the ID identification module may obtain the identification information of the external electronic device 405 by identifying a resistance value of an ID pin of the connector 460 of the external electronic device 405 through an ID pin of connector 440.

In an embodiment, when the connector 440 is another type of USB connector (e.g., a lightening connector), the CC IC 430 may be replaced with an ID identification module. In an embodiment, the ID identification module may obtain the identification information of the external electronic device 405 from the external electronic device 405 through the connector 440. In an embodiment, the ID identification module may obtain the identification information of the external electronic device 405 from the external electronic device 405 through an ID pin of the connector 440.

In an embodiment, the external electronic device 405 may include a connector 460, a CPU 471, and a USB controller (e.g., including various circuitry) 475.

In an embodiment, the connector 460 may include multiple pins 461, 465, and 469. In an embodiment, the pins 461, 465, and 469 may be connected to the pins 441, 445, and 449 of the connector 440 through the electrical path 450, respectively. In an embodiment, the CPU 471 may process data obtained through the connector 460. In an embodiment, the USB controller 475 may transmit or receive data to or from the USB controller 415 of the electronic device 401 through the connector 460.

Figure 6:
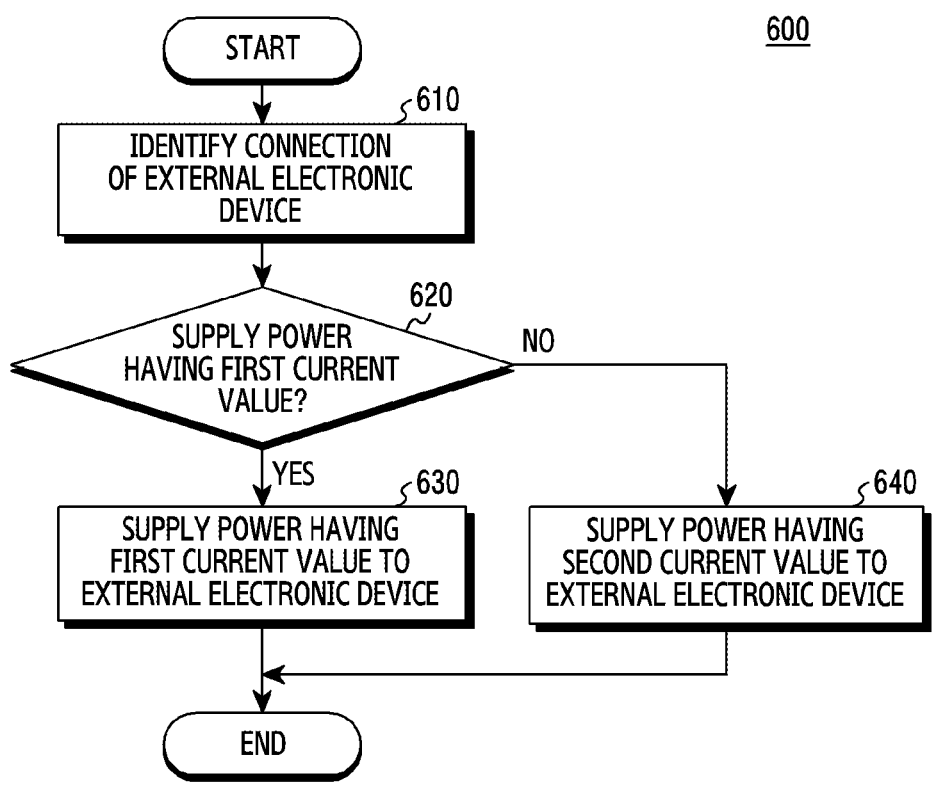
FIG. 6 is a flowchart illustrating an example operation of an electronic device according to various embodiments.
Figure 7A:
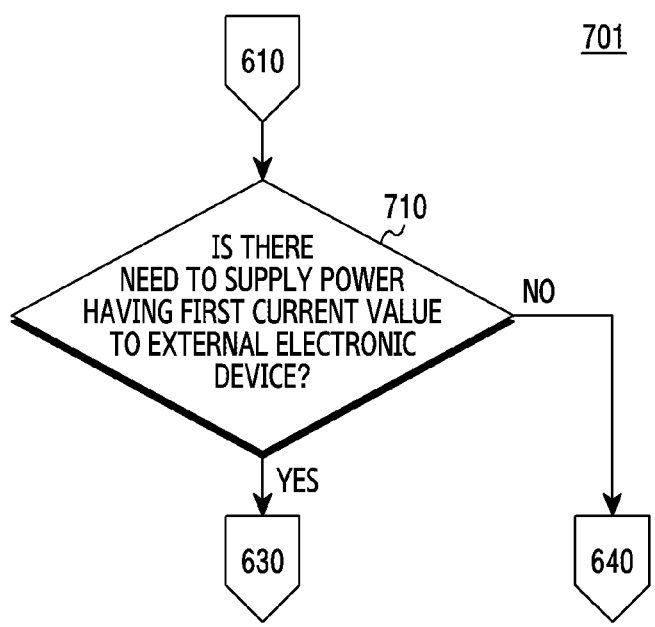
FIG. 7A is a flowchart illustrating an example operation of an electronic device according to various embodiments.
Figure 7B:
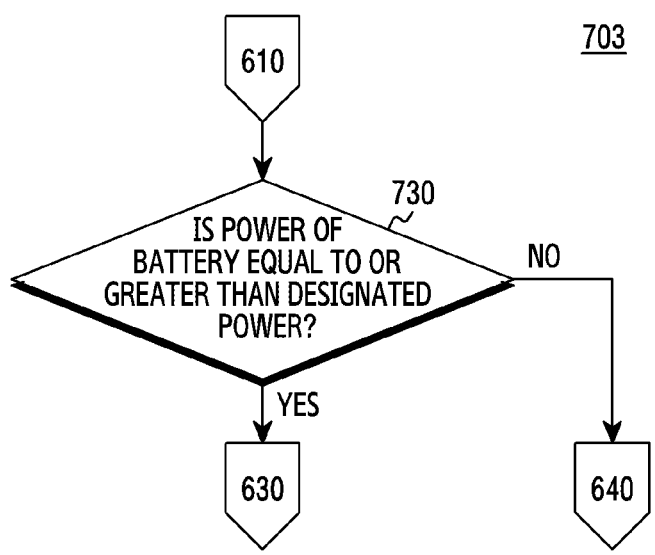
FIG. 7B is a flowchart illustrating an example operation of an electronic device according to various embodiments.
Figure 7C:
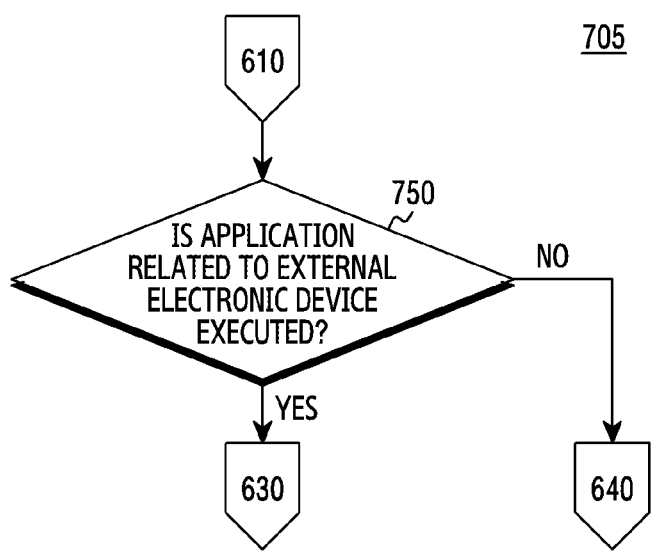
FIG. 7C is a flowchart illustrating an example operation of an electronic device according to various embodiments.

FIG. 6 is a flowchart 600 illustrating an example operation of the electronic device 401 according to various embodiments. FIG. 7A is a flowchart 701 illustrating an example operation of the electronic device 401 according to various embodiments. FIG. 7B is a flowchart 703 illustrating an example operation of the electronic device 401 according to various embodiments. FIG. 7C is a flowchart 705 illustrating an example operation of the electronic device 401 according to various embodiments. In an embodiment, operation 710 in FIG. 7A, operation 730 in FIG. 7B, and operation 750 in FIG. 7C may be included in operation 620 in FIG. 6.

Referring to FIG. 6, in operation 610, the electronic device 401 (e.g., the processor 410) may identify connection of the external electronic device 405.

In an embodiment, the electronic device 401 (e.g., the processor 410) may use the connector 440 to identify connection of the external electronic device 405. In an embodiment, the electronic device 401 (e.g., the processor 410) may identify connection of the external electronic device 405 through a designation pin (e.g., the CC pin 445) of the connector 440.

In an embodiment, the electronic device 401 (e.g., the processor 410) may use the connector 440 to obtain identification information of the external electronic device 405. In an embodiment, the electronic device 401 (e.g., the processor 410) may obtain the identification information of the external electronic device 405 using a USB PD message (e.g., VDM). In an embodiment, the identification information may include VID and PID.

Referring to FIG. 6, in operation 620, the electronic device 401 (e.g., the processor 410) may determine whether to supply power having a first current value to the external electronic device 405.

In an embodiment, when it is determined, in operation 620, to supply power having the first current value ("Yes" in operation 620), the electronic device 401 (e.g., the processor 410) may perform operation 630. In an embodiment, when it is determined, in operation 620, not to supply power having the first current value ("No" in operation 620), the electronic device 401 (e.g., the processor 410) may perform operation 640.

Referring to FIG. 7A, in operation 710, the electronic device 401 (e.g., the processor 410) may determine whether there is a need to supply power having the first current value to the external electronic device 405. In an embodiment, the electronic device 401 (e.g., the processor 410) may determine, based on the identification information of the external electronic device 405 obtained in operation 610, whether there is a need to supply power having the first current value to the external electronic device 405.

In an embodiment, the electronic device 401 (e.g., the processor 410) may determine, based on the identification information, whether the external electronic device 405 requires power having the first current value. In an embodiment, when the identification information is included in a list, the electronic device 401 (e.g., the processor 410) may determine that the external electronic device 405 requires power having the first current value.

In an embodiment, the electronic device 401 (e.g., the processor 410) may determine, based on the identification information, whether the identification information indicates a designated type of device (e.g., a device for providing contents related to AR). In an embodiment, when the identification information indicates the designated type of device, the electronic device 401 (e.g., the processor 410) may determine that the external electronic device 405 is requires power having a high current value.

In an embodiment, when it is determined, in operation 710, to supply power having the first current value ("Yes" in operation 710), the electronic device 401 (e.g., the processor 410) may perform operation 630. In an embodiment, when it is determined, in operation 710, not to supply power having the first current value ("No" in operation 710), the electronic device 401 (e.g., the processor 410) may perform operation 640.

Referring to FIG. 7B, in operation 730, the electronic device 401 (e.g., the processor 410) may determine whether power of the battery 425 is equal to or greater than a designated power.

In an embodiment, when it is determined in operation 730 that the power of the battery 425 is equal to or greater than the designated power ("Yes" in operation 730), the electronic device 401 (e.g., the processor 410) may perform operation 630. In an embodiment, when it is determined in operation 730 that the power of the battery 425 is less than the designated power ("No" in operation 730), the electronic device 401 (e.g., the processor 410) may perform operation 640.

Referring to FIG. 7C, in operation 750, the electronic device 401 (e.g., the processor 410) may determine whether the first application 510 related to the external electronic device 405 is being executed.

In an embodiment, when it is determined in operation 750 that the first application 510 related to the external electronic device 405 is being executed ("Yes" in operation 750), the electronic device 401 (e.g., the processor 410) may perform operation 630. In an embodiment, when it is determined in operation 750 that the first application 510 related to the external electronic device 405 is not being executed ("No" in operation 750), the electronic device 401 (e.g., the processor 410) may perform operation 640.

In an embodiment, the electronic device 401 (e.g., the processor 410) may determine whether to supply power having the first current value to the external electronic device 405, based on the determination result according to operation 710, the determination result according to operation 730, the determination result according to operation 750, or a combination thereof.

In an embodiment, if all of the determination result according to operation 710, the determination result according to operation 730, and the determination result according to operation 750 are "Yes", the electronic device 401 (e.g., the processor 410) may perform operation 630. In an embodiment, if at least one among the determination result according to operation 710, the determination result according to operation 730, and the determination result according to operation 750 is "No", the electronic device 401 (e.g., the processor 410) may perform operation 640.

In an embodiment, even when the first application 510 is being executed, the electronic device 401 (e.g., the processor 410) may determine, based on a function provided by the first application 510 through the external electronic device 405, whether to supply power having the first current value to the external electronic device 405. In an embodiment, when the first application 510 performs a designated function, the electronic device 401 (e.g., the processor 410) may perform operation 630. In an embodiment, the designated function may be a function for outputting contents (e.g., contents related to AR) to the external electronic device 405.

In an embodiment, even when the power of the battery 425 is less than the designated power, the electronic device 401 (e.g., the processor 410) may determine, based on whether the battery 425 is charged, whether to supply power having the first current value to the external electronic device 405. In an embodiment, even when the power of the battery 425 is less than the designated power, the electronic device 401 (e.g., the processor 410) may perform operation 630 if the battery 425 is being charged.

In an embodiment, the electronic device 401 (e.g., the processor 410) may perform operation 640 when the voltage of the battery 425 is lower than a designated voltage (e.g., 2.6 volts (V)).

In an embodiment, the electronic device 401 (e.g., the processor 410) may perform operation 640 when the temperature of the electronic device 401 (e.g., the temperature of the battery 425) exceeds a designated temperature.

Referring to FIG. 6, in operation 630, the electronic device 401 (e.g., the processor 410) may supply power having the first current value to the external electronic device 405. In an embodiment, the electronic device 401 may supply power having the first current value to the external electronic device 405 through the designated power pin 449 of the connector 440.

Referring to FIG. 6, in operation 640, the electronic device 401 (e.g., the processor 410) may supply power having a second current value to the external electronic device 405. In an embodiment, the electronic device 401 (e.g., the processor 410) may supply power having the second current value to the external electronic device 405 through the designated power pin 449 of the connector 440.

In an embodiment, operation 620 may be repeatedly performed while operation 630 or operation 640 is performed. In an embodiment, operation 620 may be performed again when information regarding a situation of the electronic device 401 (e.g., whether the first application 510 is executed, the amount of power of the battery 425, or whether the battery 425 is charged) is changed.

Figure 8:
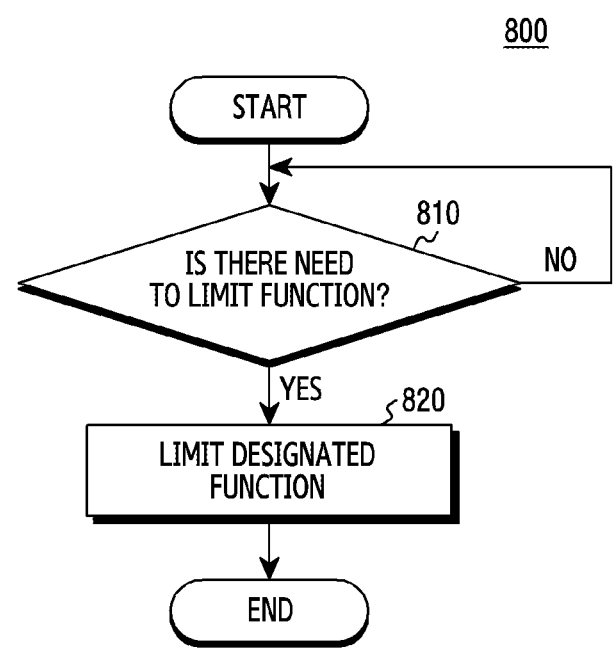
FIG. 8 is a flowchart illustrating an example operation of an electronic device according to various embodiments.

FIG. 8 is a flowchart 800 illustrating an example operation of the electronic device 401 according to various embodiments. Operations 810 and 820 in FIG. 8 may be performed while operation 630 in FIG. 6 is performed.

Referring to FIG. 8, in operation 810, the electronic device 401 (e.g., the processor 410) may determine whether there is a need to limit a function of the electronic device 401.

In an embodiment, when providing power having a first current value to the external electronic device 405, the electronic device 401 (e.g., the processor 410) may determine that there is a need to limit the function of the electronic device 401.

In an embodiment, if the battery 425 is not being charged while power having the first current value is supplied to the external electronic device 405, the electronic device 401 (e.g., the processor 410) may determine that there is a need to limit of the function of the electronic device 401. In an embodiment, if the battery 425 is being charged while power having the first current value is supplied to the external electronic device 405, the electronic device 401 (e.g., the processor 410) may determine that there is no need to limit of the function of the electronic device 401.

In an embodiment, when the temperature of the electronic device 401 (e.g., the temperature of the battery 425) exceeds a designated temperature while supplying power having the first current value to the external electronic device 405, the electronic device 401 (e.g., the processor 410) may determine that there is a need to limit the function of the electronic device 401. In an embodiment, a temperature reference for determining a current value of power to be supplied to the external electronic device 405 may be different from a temperature reference for determining whether to limit the function of the electronic device 401. In an embodiment, the temperature reference for determining whether to limit the function of the electronic device 401 may be lower than the temperature reference for determining a current value of power to be supplied to the external electronic device 405.

In an embodiment, when it is determined in operation 810 that there is a need to limit the function of the electronic device 401 ("Yes" in operation 810), the electronic device 401 (e.g., the processor 410) may perform operation 820. In an embodiment, when it is determined in operation 810 that there is no need to limit the function of the electronic device 401 ("No" in operation 810), the electronic device 401 (e.g., the processor 410) may perform operation 810 again.

Referring to FIG. 8, in operation 820, the electronic device 401 (e.g., the processor 410) may limit a designated function of the electronic device 401.

In an embodiment, the electronic device 401 (e.g., the processor 410) may stop driving of the second application 520 (e.g., an application for providing a payment service) which is unrelated to the external electronic device 405. In an embodiment, the electronic device 401 (e.g., the processor 410) may stop driving of an application that does not transmit or receive data to or from the external electronic device 405.

In an embodiment, the electronic device 401 (e.g., the processor 410) may limit the function of a hardware element which is not used by the first application 510. In an embodiment, the electronic device 401 (e.g., the processor 410) may limit the luminance of a display (e.g., the display device 160 in FIG. 1). In an embodiment, the electronic device 401 (e.g., the processor 410) may limit driving of a camera (e.g., the camera module 180 in FIG. 1).

An electronic device according to an example embodiment may include: a battery; a connector including multiple pins; and a processor, wherein the processor is configured to: identify an external electronic device electrically connected through the connector; identify, among at least two supportable current values, a current value of power to be supplied to the external electronic device; and supply, based on the identified current value, power of the battery to the external electronic device through the connector, wherein the electronic device may be configured to perform, among the roles of a host and a peripheral device, the role of the host while being connected to the external electronic device through the connector.

In an example embodiment, the processor may be configured to identify the current value, based on identification information of the external electronic device.

In an example embodiment, the processor may be configured to: identify, based on the identification information, the type of the external electronic device; and identify the current value, based on the type of the external electronic device.

In an example embodiment, the processor may be configured to identify the current value, based on whether an application related to the external electronic device is executed.

In an example embodiment, the processor may be configured to identify the current value, based on a function provided by the application, based on the application being executed.

In an example embodiment, the processor may be configured to identify the current value, based on the amount of electric charge of the battery.

In an example embodiment, the processor may be configured to identify the current value, based on whether the battery is charged.

In an example embodiment, the processor may be configured to identify the current value, based on the temperature of the electronic device.

In an example embodiment, the processor may be configured to limit, based on the identified current value being greater than a designated current value, a designated function of the electronic device while the power of the battery is supplied to the external electronic device based on the identified current value.

In an example embodiment, the processor may be configured to limit the designated function by limiting a payment service, a luminance of a display (e.g., the luminance of the display device 160), a camera (e.g., the camera module 180), or a combination thereof while the power of the battery is supplied to the external electronic device based on the identified current value.

A method of operating an electronic device according to an example embodiment may include: identifying an external electronic device electrically connected through a connector of the electronic device; identifying, among at least two supportable current values, a current value of power to be supplied to the external electronic device; and supplying, based on the identified current value, power of a battery of the electronic device to the external electronic device through the connector, wherein the electronic device is configured to perform, among the roles of a host and a peripheral device, the role of the host while being connected to the external electronic device through the connector.

In an example embodiment, the identifying of the current value may include identifying the current value, based on identification information of the external electronic device.

In an example embodiment, the identifying of the current value may include: identifying, based on the identification information, the type of the external electronic device; and identifying the current value, based on the type of the external electronic device.

In an example embodiment, the identifying of the current value may include identifying the current value, based on whether an application related to the external electronic device is executed.

In an example embodiment, the identifying of the current value may include identifying the current value, based on a function provided by the application, based on the application being executed.

In an example embodiment, the identifying of the current value may include identifying the current value, based on the amount of electric charge of the battery.

In an example embodiment, the identifying of the current value may include identifying the current value, based on whether the battery is charged.

In an example embodiment, the identifying of the current value may include identifying the current value, based on the temperature of the electronic device.

In an example embodiment, the method may further include: limiting, based on the identified current value being greater than a designated current value, a designated function of the electronic device while power of the battery is supplied to the external electronic device based on the identified current value.

In an example embodiment, the limiting of the designated function of the electronic device may include: limiting the designated function by limiting a payment service, the luminance of a display (e.g., the luminance of the display device 160), a camera (e.g., the camera module 180), or a combination thereof while power of the battery is supplied to the external electronic device based on the identified current value.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
    a battery;
    a connector comprising multiple pins;
    at least one processor;
    and
    memory storing instructions that, when executed by the at least one processor, cause the electronic device to:
        identify a connection with an external electronic device through the connector,
        in case that an application related to the external electronic device is executed and a state of charging (SOC) of the battery is equal to or higher than a designated value, identify, among a first current value and a second current value higher than the first current value, the second current value as a current value of power to be supplied to the external electronic device, and
        in case that the power corresponding to the second current value is supplied to the external electronic device, limit a luminance of a display of the electronic device,
        wherein the electronic device is configured to manage a data flow between the electronic device and the external electronic device.

2. The electronic device of claim 1, wherein the instructions, when executed by the at least one processor, cause the electronic device to:
    in case that the SOC of the battery is lower than the designated value, identify the first current value as the current value of the power to be supplied to the external electronic device.

3. The electronic device of claim 1, wherein the instructions, when executed by the at least one processor, cause the electronic device to:
    identify a type of the external electronic device based on identification information on the external electronic device; and
    identify the current value based on the type of the external electronic device.

4. The electronic device of claim 1, wherein the current value is identified based on a function provided by the application related to the external electronic device.

5. The electronic device of claim 1, wherein the SOC of the battery is based on an amount of electric charge of the battery.

6. The electronic device of claim 1, wherein the instructions, when executed by the at least one processor, cause the electronic device to identify the current value based on whether the battery is charged.

7. The electronic device of claim 1, wherein the instructions, when executed by the at least one processor, cause the electronic device to identify the current value based on a temperature of the electronic device.

8. The electronic device of claim 1, wherein the first current value includes 0.9 ampere and the second current value includes 1.5 ampere, and wherein the designated value corresponds to 30 percent.

9. The electronic device of claim 1, wherein the instructions, when executed by the at least one processor, cause the electronic device to further limit a payment service, in case that the power corresponding to the second current value is supplied to the external electronic device.

10. A method of operating an electronic device, the method comprising:
    identifying a connection with an external electronic device through a connector included in the electronic device;
    in case that an application related to the external electronic device is executed and a state of charging (SOC) of a battery included in the electronic device is equal to or higher than a designated value, identifying, among a first current value and a second current value higher than the first current value, the second current value as a current value of power to be supplied to the external electronic device; and
    in case that the power corresponding to the second current value is supplied to the external electronic device, limiting a luminance of a display of the electronic device,
    wherein the electronic device is configured to manage a data flow between the electronic device and the external electronic device.

11. The method of claim 10, further comprising:
    in case that the SOC of the battery is lower than the designated value, identifying the first current value as the current value of the power to be supplied to the external electronic device.

12. The method of claim 10, further comprising:
    identifying, based on identification information on the external electronic device, a type of the external electronic device; and
    identifying the current value based on the type of the external electronic device.

13. The method of claim 10, wherein the current value is identified based on a function provided by the an application related to the external electronic device.

14. The electronic device of claim 1, wherein the instructions, when executed by the at least one processor, cause the electronic device to further limit a flash of a camera of the electronic device, in case that the power corresponding to the second current value is supplied to the external electronic device.

15. The method of claim 10, further comprising:
    in case that the power corresponding to the second current value is supplied to the external electronic device, limiting a payment service of the electronic device.

16. The method of claim 10, further comprising:
in case that the power corresponding to the second current value is supplied to the external electronic device, limiting a flash of a camera of the electronic device.

* * * * *